(12) United States Patent
Prather et al.

(10) Patent No.: US 11,195,569 B2
(45) Date of Patent: *Dec. 7, 2021

(54) MEMORY DEVICES CONFIGURED TO PROVIDE EXTERNAL REGULATED VOLTAGES

(71) Applicant: Micron Technology, Inc., Boise, ID (US)

(72) Inventors: Matthew A. Prather, Boise, ID (US); Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

This patent is subject to a terminal disclaimer.

(21) Appl. No.: 16/423,427

(22) Filed: May 28, 2019

(65) Prior Publication Data
US 2019/0279705 A1    Sep. 12, 2019

Related U.S. Application Data

(63) Continuation of application No. 16/109,499, filed on Aug. 22, 2018, now Pat. No. 10,395,721.
(Continued)

(51) Int. Cl.
*G11C 11/4074* (2006.01)
*G06F 13/10* (2006.01)
(Continued)

(52) U.S. Cl.
CPC ........ *G11C 11/4074* (2013.01); *G06F 13/102* (2013.01); *G06F 1/26* (2013.01); *H02M 3/156* (2013.01)

(58) Field of Classification Search
CPC .......................... G06F 13/102; G11C 11/4074
(Continued)

(56) References Cited

U.S. PATENT DOCUMENTS 7,796,414 B2    9/2010   Hofstra
8,930,647 B1 *  1/2015   Smith .................. G06F 3/0661
                                             711/154
(Continued)

OTHER PUBLICATIONS

International Application No. PCT/US2018/047604—International Search Report and Written Opinion, dated Feb. 1, 2019, 16 pages.
(Continued)

*Primary Examiner* — Idriss N Alrobaye
*Assistant Examiner* — Brooke J Taylor
(74) *Attorney, Agent, or Firm* — Perkins Coie LLP

(57) ABSTRACT

Memory devices, systems including memory devices, and methods of operating memory devices and systems in which a memory device can include a voltage regulator for adjusting a supply voltage to an output voltage and providing the output voltage to other devices external to the memory device (e.g., other memory devices in the same memory system, processors, graphics chipsets, other logic circuits, expansion cards, etc.). A memory device may comprise one or more external inputs configured to receive a supply voltage having a first voltage level; a voltage regulator configured to receive the supply voltage from the one or more external inputs and to output an output voltage having a second voltage level different from the first voltage level; one or more memories configured to receive the output voltage from the voltage regulator; and one or more external outputs configured to supply the output voltage to one or more connected devices.

19 Claims, 10 Drawing Sheets

Related U.S. Application Data

(60) Provisional application No. 62/635,429, filed on Feb. 26, 2018.

(51) Int. Cl.
*G06F 1/26* (2006.01)
*H02M 3/156* (2006.01)

(58) Field of Classification Search
USPC .............................................................. 710/5
See application file for complete search history.

(56) References Cited

U.S. PATENT DOCUMENTS

| | | |
|---|---|---|
| 10,395,721 B1 | 8/2019 | Prather et al. |
| 10,665,288 B2 | 5/2020 | Prather et al. |
| 2006/0174140 A1 | 8/2006 | Harris et al. |
| 2006/0189175 A1 | 8/2006 | Kinsley |
| 2006/0294437 A1 | 12/2006 | Washburn et al. |
| 2007/0043987 A1* | 2/2007 | Sutardja ............. G01R 31/2884 714/724 |
| 2008/0231243 A1 | 9/2008 | Zhong et al. |
| 2010/0084917 A1* | 4/2010 | Tsao .................... H01R 25/00 307/31 |
| 2010/0128447 A1 | 5/2010 | Macdougall et al. |
| 2012/0025767 A1* | 2/2012 | Cha ......................... G06F 1/26 320/111 |
| 2014/0156924 A1* | 6/2014 | Jeon ...................... G11C 5/147 711/108 |
| 2014/0281600 A1* | 9/2014 | Wells .................... G06F 1/3275 713/320 |
| 2014/0372777 A1* | 12/2014 | Reller ................... G06F 1/3253 713/320 |
| 2015/0378385 A1 | 12/2015 | Rana et al. |
| 2016/0350002 A1 | 12/2016 | Vergis et al. |
| 2017/0115712 A1 | 4/2017 | Davis et al. |
| 2017/0220087 A1* | 8/2017 | Hijazi ....................... G06F 1/30 |
| 2017/0243626 A1 | 8/2017 | Bacchus et al. |
| 2017/0249991 A1 | 8/2017 | Han et al. |
| 2017/0294216 A1 | 10/2017 | Doo et al. |
| 2017/0308724 A1 | 10/2017 | Kothamasu et al. |
| 2017/0344498 A1* | 11/2017 | Voor ..................... G06F 13/161 |
| 2018/0246662 A1* | 8/2018 | Kim ......................... G11C 5/04 |
| 2018/0337586 A1 | 11/2018 | Choi et al. |
| 2019/0018468 A1 | 1/2019 | Kang et al. |
| 2019/0267071 A1 | 8/2019 | Prather et al. |
| 2020/0234753 A1 | 7/2020 | Prather et al. |
| 2020/0293419 A1 | 9/2020 | Messick et al. |

OTHER PUBLICATIONS

U.S. Appl. No. 16/109,520—Unpublished Patent Application by Matthew A. Prather et al., titled "Memory Devices Configured to Provide External Regulated Voltages", filed Aug. 22, 2018, 36 pages.

KR Patent Application No. 10-2020-7024334—Korean Office Action and Search Report, dated Sep. 1, 2021, with English Translation, 16 pages.

\* cited by examiner

MEMORY DEVICES CONFIGURED TO PROVIDE EXTERNAL REGULATED VOLTAGES

CROSS-REFERENCE TO RELATED APPLICATIONS

This application is a continuation of U.S. application Ser. No. 16/109,499, filed Aug. 22, 2018; which claims the benefit of U.S. Provisional Application No. 62/635,429, filed Feb. 26, 2018; each of which is incorporated herein by reference in its entirety.

This application contains subject matter related to an U.S. patent application by Matthew A. Prather et al. titled "MEMORY DEVICES CONFIGURED TO PROVIDE EXTERNAL REGULATED VOLTAGES". The related application is assigned to Micron Technology, Inc., and is identified as Ser. No. 16/109,520, filed Aug. 22, 2018. The subject matter thereof is incorporated herein by reference thereto.

TECHNICAL FIELD

The present disclosure generally relates to memory devices, and more particularly relates to memory devices configured to provide external regulated voltages.

BACKGROUND

Memory devices are widely used to store information related to various electronic devices such as computers, wireless communication devices, cameras, digital displays, and the like. Information is stored by programming different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Memory devices can utilize power supply potentials (e.g., at low voltages such as 1.1V or the like) with narrow voltage tolerances. Generating the tightly-controlled power supply potentials for the memories internally to a memory module, rather than externally on a host device, can reduce the cost to host device (e.g., motherboard) manufacturers. As memory modules may not be the only devices connected to a motherboard to make use of these and similarly tightly-controlled potentials, several embodiments of the present technology are directed to memory devices, systems including memory devices, and methods of operating memory devices and systems in which a memory device can include a voltage regulator (e.g., a power management integrated circuit) for adjusting a supply voltage to an output voltage and providing the output voltage to other devices external to the memory device (e.g., other memory devices in the same memory system, non-memory devices such as processors, graphics chipsets, other logic circuits, expansion cards, etc.).

Figure 1:
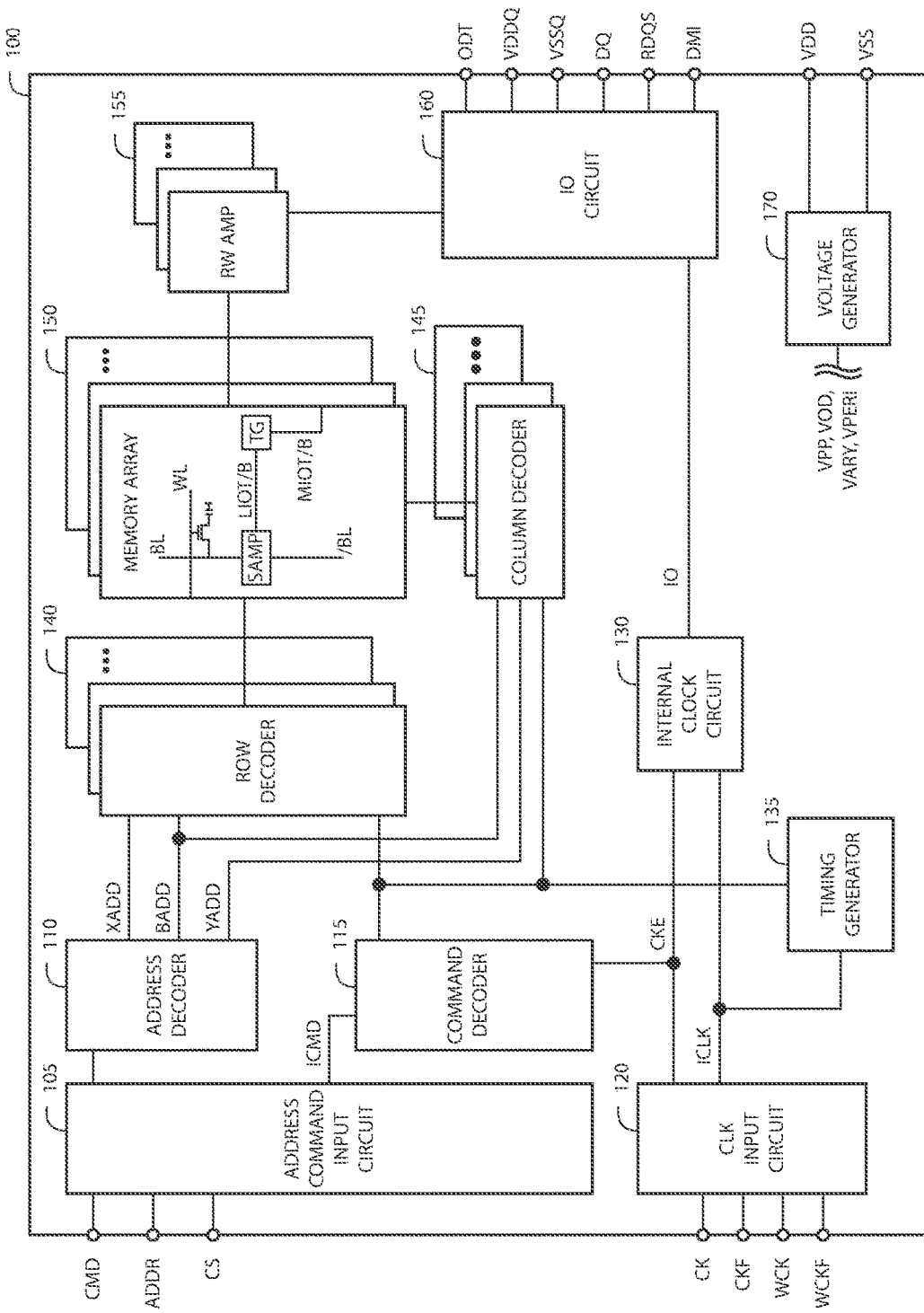
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, an input buffer can receive the CK and CKF signals and the WCK and WCKF signals, and the clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

One approach to providing various power supply potentials to the corresponding terminals can include providing the memory device 100 on a module (e.g., a dual in-line memory module (DIMM) or the like) to which the various power supply potentials are provided by a host device (e.g., by a power supply unit (PSU) connected to the same motherboard, or the like). In view of the narrow tolerances (e.g., less than 5%, less than 3%, even narrower, etc.) to which the power supply potentials may need to conform for higher-performing (e.g., faster, lower-power, etc.) memory devices, equipping a host device with the capability to provide these tightly-controlled power supply potentials to a memory module can be a costly challenge.

Accordingly, another approach involves providing one or more voltage regulator and/or power management integrated circuits (PMICs) on a memory module to generate the tightly-controlled power supply potentials (e.g., at low voltages such as 1.1V or the like) for the memory devices thereon from a supply voltage (e.g., a system voltage of 12V, 5V, 3.3V or the like) that need not be held to such tight tolerances. Generating the tightly-controlled power supply potentials for the VDD, VDDQ, VSS, VPP, and other power supply terminals for the memory devices on the module can reduce the cost to host device (e.g., motherboard) manufacturers associated with providing these potentials to connected memory modules.

As memory modules may not be the only devices connected to a motherboard to make use of these and similarly tightly-controlled potentials, embodiments of the present technology provide a way for memory modules that include one or more voltage regulators and/or PMICs to output tightly-controlled potentials from the memory module for use by other devices (e.g., CPUs, GPUs, expansion cards, other chipsets, etc.) connected to the same motherboard. This approach can completely free the motherboard (e.g., or a power supply connected thereto) from the need to provide tight voltage regulation and/or operating voltages for memory devices and other lower-voltage (e.g., <5V, <3.3V etc.) devices, instead relying upon the voltage conversion and regulation performed by the memory modules to provide tightly-controlled potentials for any connected device in need thereof.

Figure 2:
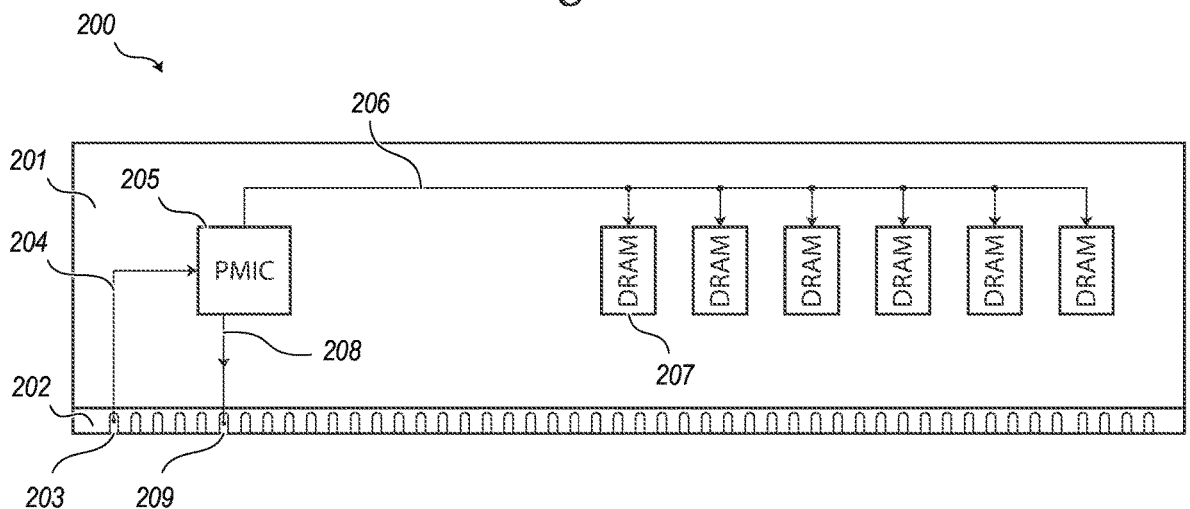
FIGS. 2-9 are simplified block diagrams schematically illustrating memory devices in accordance with various embodiments of the present technology.

In this regard, FIG. 2 illustrates a memory device 200 in accordance with one embodiment of the present technology. Memory device 200 can be a memory module, such as a dual in-line memory module (DIMM) or the like, having a substrate (e.g., a printed circuit board (PCB) or the like) 201 and an edge connector 202 on which a number of contacts are provided. While many of the contacts on edge connector 202 are configured to carry data, commands, addresses, clocks, enable signals or the like, others can be configured to supply a potential to the memory device 200, such as connector 203. As can be seen with reference to FIG. 2, connector 203 receives a supply voltage 204 from an external device (e.g., a host device to which the memory device 200 is connected by the edge connector 202) and provides the supply voltage 204 to a voltage regulator such as PMIC 205. The PMIC 205 can convert the supply voltage 204 to one or more output voltages (e.g., VDD, VDDQ, VPP, VSS, VSSQ, etc.), such as output voltage 206 for use by one or more connected memories, such as DRAM memories 207 (e.g., which can correspond to the memory device 100 illustrated in FIG. 1 and described in greater detail above). In this regard, the output voltage 206 can have a different voltage level (e.g., 1.1V, 1.3V, 1.5V, etc.) than that of the supply voltage 204 (e.g., 12V, 5V, 3.3V, etc.), and/or can have a different tolerance (e.g. ±1%, ±3%, ±5%, etc.) than that of the supply voltage 204 (e.g. ±5%, ±10%, etc.). The PMIC 205 can further supply the output voltage 208 to an output contact 209 on the edge connector 202, to enable the memory device 200 to provide the converted and/or regulated output voltage 208 to one or more devices external to the memory device 200 (e.g., another memory device without a PMIC, a processor, a chipset, another logic circuit, an expansion card, etc.).

Figure 3:
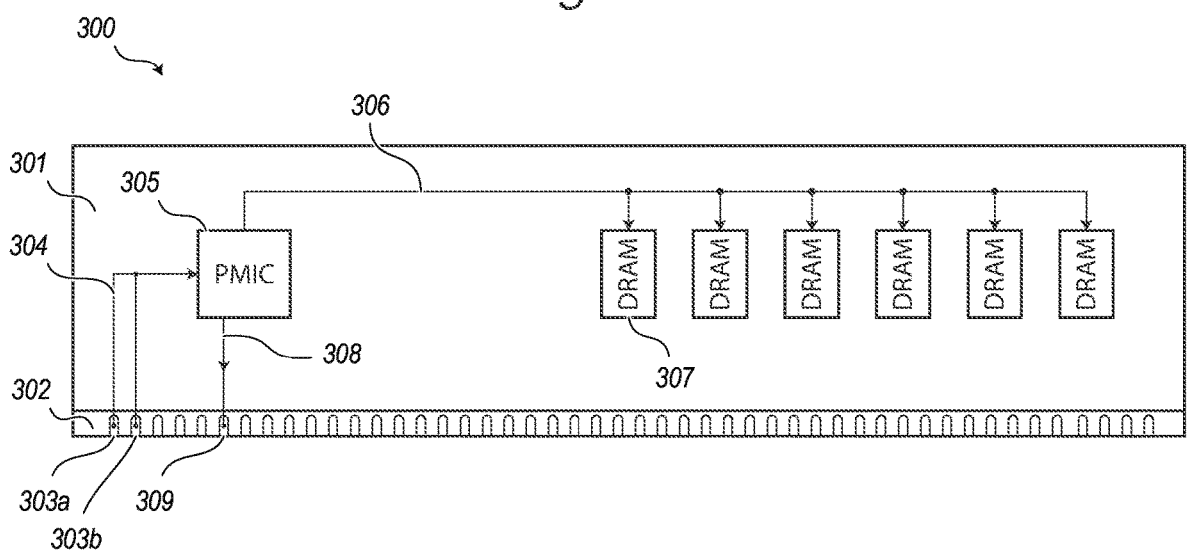

In some embodiments, the current drawn by a memory device and any external devices connected thereto can be more easily carried (e.g., with reduced losses to resistive heating) by a plurality of traces and/or contacts on an edge connector. Such an embodiment is shown in FIG. 3, which illustrates a memory device 300 in accordance with one embodiment of the present technology. Memory device 300 can be a memory module, such as a DIMM or the like, having a substrate (e.g., a printed circuit board (PCB) or the like) 301 and an edge connector 302 on which a number of contacts are provided. While many of the contacts on edge connector 302 are configured to carry data, commands, addresses, enable signals or the like, others can be configured to supply a potential to the memory device 300, such as connectors 303a and 303b. As can be seen with reference to FIG. 3, connectors 303a and 303b receive a supply voltage 304 from an external device (e.g., a host device to which the memory device 300 is connected by the edge connector 302) and provide the supply voltage 304 to a voltage regulator such as PMIC 305. The PMIC 305 can convert the supply voltage 304 to one or more output voltages (e.g., VDD, VDDQ, VPP, VSS, VSSQ, etc.), such as output voltage 306 for use by one or more connected memories, such as DRAM memories 307 (e.g., which can correspond to the memory device 100 illustrated in FIG. 1 and described in greater detail above). In this regard, the output voltage 306 can have a different voltage level (e.g., 1.1V, 1.3V, 1.5V, etc.) than that of the supply voltage 304 (e.g., 12V, 5V, 3.3V, etc.), and/or can have a different tolerance (e.g. ±1%, ±3%, ±5%, etc.) than that of the supply voltage 304 (e.g. ±5%, ±10%, etc.). The PMIC 305 can further supply the output voltage 308 to an output contact 309 on the edge connector 302, to enable the memory device 300 to provide the converted and/or regulated output voltage 308 to one or more devices external to the memory device 300 (e.g., another memory device without a PMIC, a processor, a chipset, another logic circuit, an expansion card, etc.).

Figure 4:
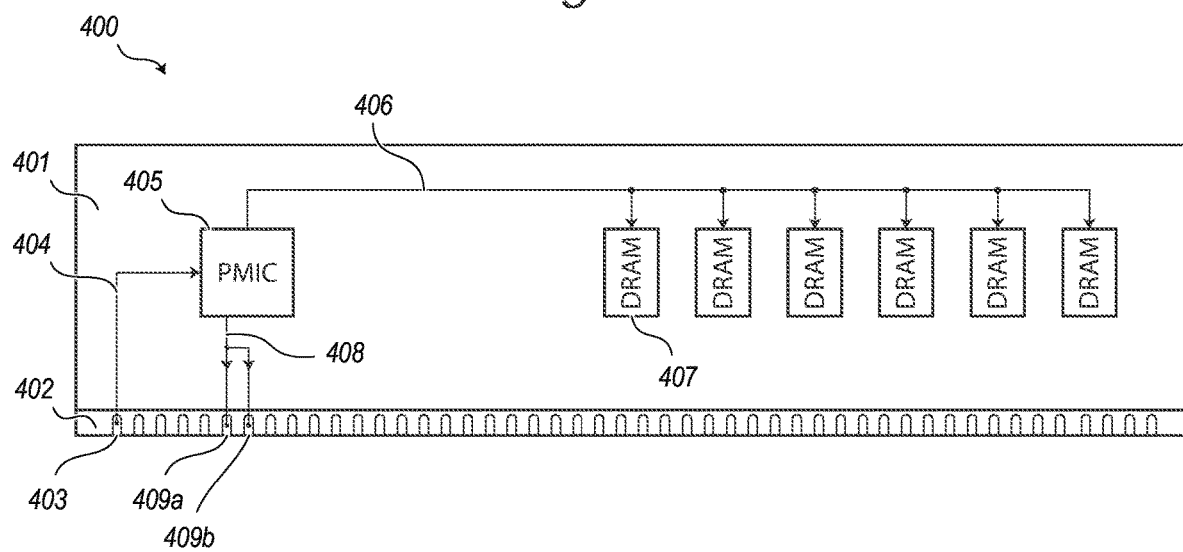

In a similar fashion, FIG. 4 illustrates a memory device 400 in accordance with one embodiment of the present technology in which the output current supplied by a memory device to one or more external devices connected thereto can be more easily carried (e.g., with reduced losses to resistive heating) by a plurality of traces and/or contacts on an edge connector. Memory device 400 can be a memory module, such as a DIMM or the like, having a substrate (e.g., a printed circuit board (PCB) or the like) 401 and an edge connector 402 on which a number of contacts are provided. While many of the contacts on edge connector 402 are configured to carry data, commands, addresses, enable signals or the like, others can be configured to supply a potential to the memory device 400, such as connector 403. As can be seen with reference to FIG. 4, connector 403 receives a supply voltage 404 from an external device (e.g., a host device to which the memory device 400 is connected by the edge connector 402) and provides the supply voltage 404 to a voltage regulator such as PMIC 405. The PMIC 405 can convert the supply voltage 404 to one or more output voltages (e.g., VDD, VDDQ, VPP, VSS, VSSQ, etc.), such as output voltage 406 for use by one or more connected memories, such as DRAM memories 407 (e.g., which can correspond to the memory device 100 illustrated in FIG. 1 and described in greater detail above). In this regard, the output voltage 406 can have a different voltage level (e.g., 1.1V, 1.3V, 1.5V, etc.) than that of the supply voltage 404 (e.g., 12V, 5V, 3.3V, etc.), and/or can have a different tolerance (e.g. ±1%, ±3%, ±5%, etc.) than that of the supply voltage 404 (e.g. ±5%, ±10%, etc.). The PMIC 405 can further supply the output voltage 408 to multiple output contacts on the edge connector 402, such as output contacts 409a and 409b, to enable the memory device 400 to provide the converted and/or regulated output voltage 408 to one or more devices external to the memory device 400 (e.g., another memory device without a PMIC, a processor, a chipset, another logic circuit, an expansion card, etc.).

Figure 5:
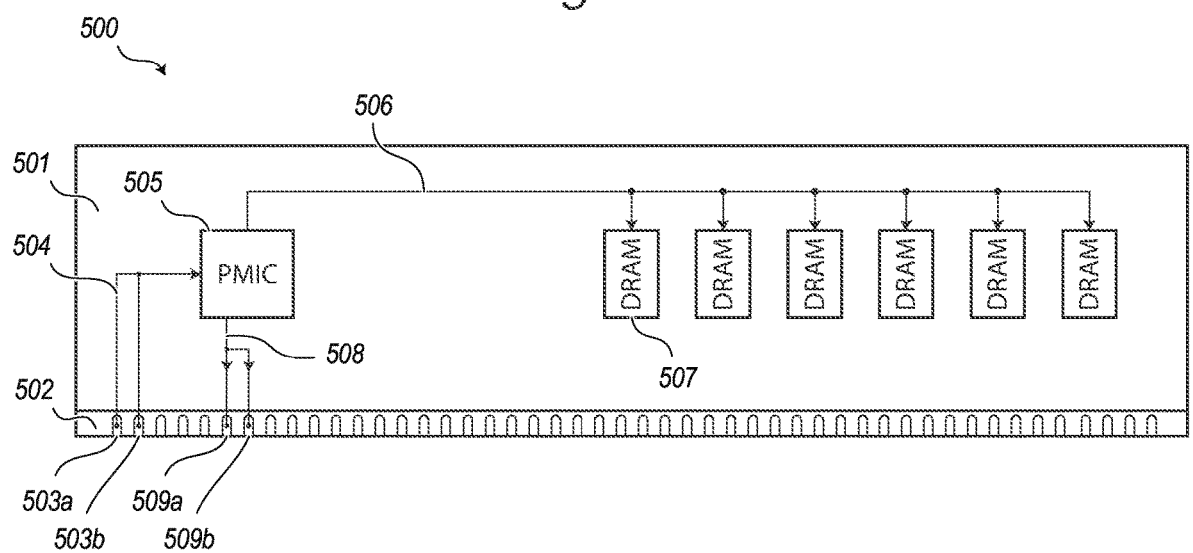

In yet other memory devices, both the supply voltage and the output voltage can be ganged across multiple connectors to increase the power-carrying capabilities thereof, as illustrated in FIG. 5 in accordance with another aspect of the present technology. As can be seen with reference to FIG. 5, such a memory device 500 can be a memory module, such as a DIMM or the like, having a substrate (e.g., a printed circuit board (PCB) or the like) 501 and an edge connector 502 on which a number of contacts are provided. While many of the contacts on edge connector 502 are configured to carry data, commands, addresses, enable signals or the like, others can be configured to supply a potential to the memory device 500, such as connectors 503a and 503b. As can be seen with reference to FIG. 5, connectors 503a and 503b receive a supply voltage 504 from an external device (e.g., a host device to which the memory device 500 is connected by the edge connector 502) and provide the supply voltage 504 to a voltage regulator such as PMIC 505. The PMIC 505 can convert the supply voltage 504 to one or more output voltages (e.g., VDD, VDDQ, VPP, VSS, VSSQ, etc.), such as output voltage 506 for use by one or more connected memories, such as DRAM memories 507 (e.g., which can correspond to the memory device 100 illustrated in FIG. 1 and described in greater detail above). In this regard, the output voltage 506 can have a different voltage level (e.g., 1.1V, 1.3V, 1.5V, etc.) than that of the supply voltage 504 (e.g., 12V, 5V, 3.3V, etc.), and/or can have a different tolerance (e.g. ±1%, ±3%, ±5%, etc.) than that of the supply voltage 504 (e.g. ±5%, ±10%, etc.). The PMIC 505 can further supply the output voltage 508 to multiple output contacts on the edge connector 502, such as output contacts 509a and 509b, to enable the memory device 500 to provide the converted and/or regulated output voltage 508 to one or more devices external to the memory device 500 (e.g., another memory device without a PMIC, a processor, a chipset, another logic circuit, an expansion card, etc.).

Figure 6:
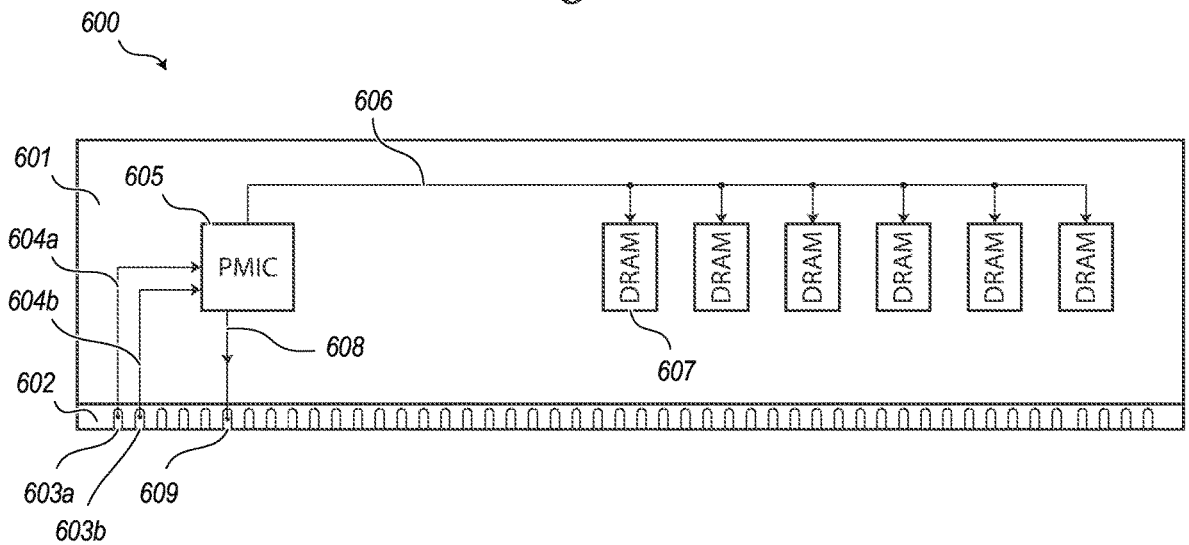

Although in the foregoing example embodiments, memory devices have been illustrated in which a single supply voltage is provided to either one or multiple contacts of an edge connector, in other embodiments a memory device can be configured to receive multiple different supply voltages to be regulated and/or converted for use by the memory device and by external devices connected thereto. FIG. 6 illustrates one such memory device in accordance with an embodiment of the present technology. As can be seen with reference to FIG. 6, memory device 600 can be a memory module, such as a DIMM or the like, having a substrate (e.g., a printed circuit board (PCB) or the like) 601 and an edge connector 602 on which a number of contacts are provided. While many of the contacts on edge connector 602 are configured to carry data, commands, addresses, enable signals or the like, others can be configured to supply a potential to the memory device 600, such as connectors 603a and 603b. As can be seen with reference to FIG. 6, connectors 603a and 603b receive corresponding supply voltages 604a and 604b from one or more external devices (e.g., a host device to which the memory device 600 is connected by the edge connector 602) and provide the supply voltages 604a and 604b to one or more voltage regulators, such as PMIC 605. The PMIC 605 can convert the supply voltages 604a and 604b to one or more output voltages (e.g., VDD, VDDQ, VPP, VSS, VSSQ, etc.), such as first output voltage 606 for use by one or more connected memories, such as DRAM memories 607 (e.g., which can correspond to the memory device 100 illustrated in FIG. 1 and described in greater detail above). In this regard, the output voltage 606 can have a different voltage level (e.g., 1.1V, 1.3V, 1.5V, etc.) than that of the supply voltage 604 (e.g., 12V, 5V, 3.3V, etc.), and/or can have a different tolerance (e.g. ±1%, ±6%, ±5%, etc.) than that of the supply voltage 604 (e.g. ±5%, ±10%, etc.). The PMIC 605 can further supply one of the one or more output voltages, such as second output voltage 608 to an output contact 609 on the edge connector 602, to enable the memory device 600 to provide the converted and/or regulated second output voltage 608 to one or more devices external to the memory device 600 (e.g., another memory device without a PMIC, a processor, a chipset, another logic circuit, an expansion card, etc.).

Figure 7:
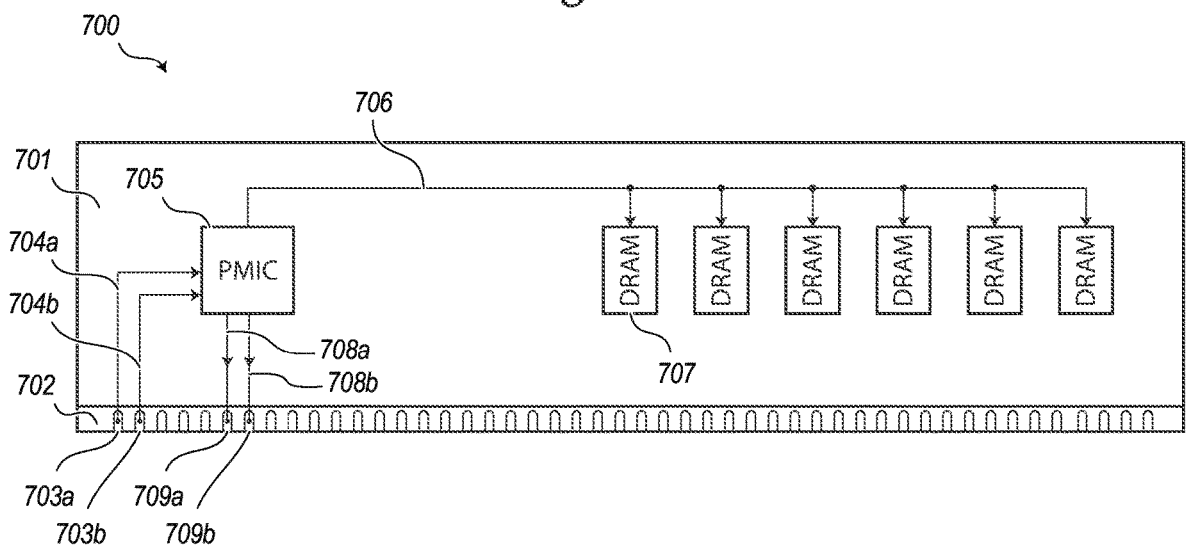

Although in the foregoing example embodiments, memory devices have been illustrated as providing a single output voltage to external devices connected to one or more contacts of the edge connectors of the memory devices, in other embodiments, a memory device can provide multiple different output voltages via different connectors to one or more external devices. FIG. 7 illustrates one such memory device 700 in accordance with an embodiment of the present technology. As can be seen with reference to FIG. 7, memory device 700 can be a memory module, such as a DIMM or the like, having a substrate (e.g., a printed circuit board (PCB) or the like) 701 and an edge connector 702 on which a number of contacts are provided. While many of the contacts on edge connector 702 are configured to carry data, commands, addresses, enable signals or the like, others can be configured to supply a potential to the memory device 700, such as connectors 703a and 703b. As can be seen with reference to FIG. 7, connectors 703a and 703b receive corresponding supply voltages 704a and 704b from an external device (e.g., a host device to which the memory device 700 is connected by the edge connector 702) and provide the supply voltages 704a and 704b to a voltage regulator such as PMIC 705. The PMIC 705 can convert the supply voltages 704a and 704b to one or more output voltages (e.g., VDD, VDDQ, VPP, VSS, VSSQ, etc.), such as output voltage 706 for use by one or more connected memories, such as DRAM memories 707 (e.g., which can correspond to the memory device 100 illustrated in FIG. 1 and described in greater detail above). In this regard, the output voltage 706 can have a different voltage level (e.g., 1.1V, 1.3V, 1.5V, etc.) than that of the supply voltage 704 (e.g., 12V, 5V, 3.3V, etc.), and/or can have a different tolerance (e.g. ±1%, ±3%, ±5%, etc.) than that of the supply voltage 704 (e.g. ±5%, ±10%, etc.). The PMIC 705 can further supply multiple different output voltages 708a and 708b to multiple output contacts on the edge connector 702, such as output contacts 709a and 709b, to enable the memory device 700 to provide the converted and/or regulated output voltages 708a and 708b to one or more devices external to the memory device 700 (e.g., another memory device without a PMIC, a processor, a chipset, another logic circuit, an expansion card, etc.).

Figure 8:
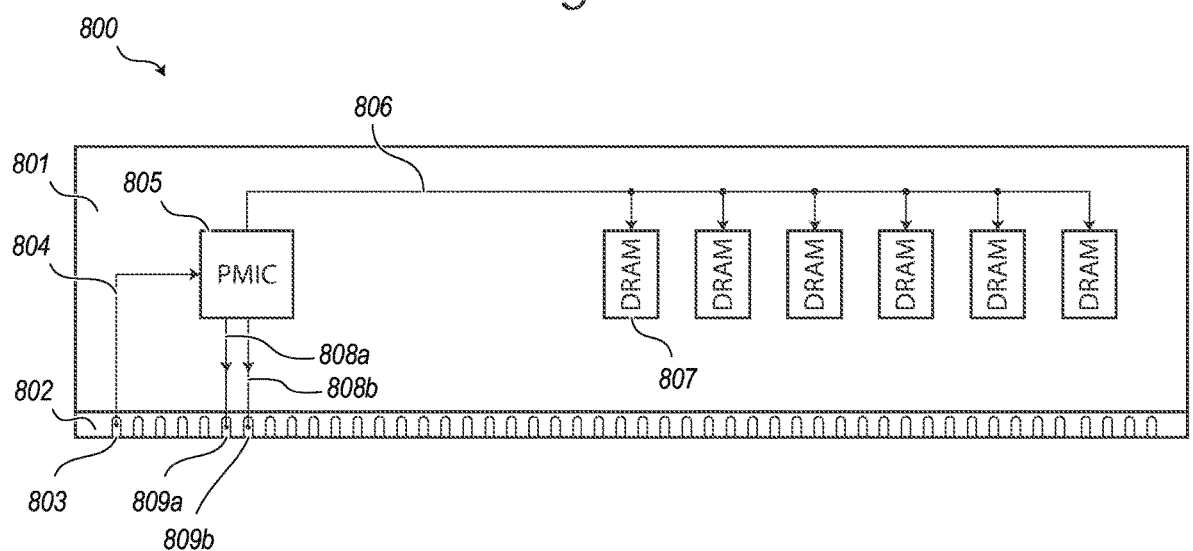

Although in the foregoing example embodiments, memory devices have been illustrated and described as generating multiple output voltages from multiple received supply voltages, in other embodiments, a memory device can provide multiple different output voltages to external devices from a single input voltage. FIG. 8 illustrates one such memory device 800 in accordance with an embodiment of the present technology. As can be seen with reference to FIG. 8, memory device 800 can be a memory module, such as a DIMM or the like, having a substrate (e.g., a printed circuit board (PCB) or the like) 801 and an edge connector 802 on which a number of contacts are provided. While many of the contacts on edge connector 802 are configured to carry data, commands, addresses, enable signals or the like, others can be configured to supply a potential to the memory device 800, such as connector 803. As can be seen with reference to FIG. 8, connector 803 receives corresponding a supply voltage 804 from an external device (e.g., a host device to which the memory device 800 is connected by the edge connector 802) and provides the supply voltage 804 to a voltage regulator such as PMIC 805. The PMIC 805 can convert the supply voltage 804 to one or more output voltages (e.g., VDD, VDDQ, VPP, VSS, VSSQ, etc.), such as output voltage 806 for use by one or more connected memories, such as DRAM memories 807 (e.g., which can correspond to the memory device 100 illustrated in FIG. 1 and described in greater detail above). In this regard, the output voltage 806 can have a different voltage level (e.g., 1.1V, 1.3V, 1.5V, etc.) than that of the supply voltage 804 (e.g., 12V, 5V, 3.3V, etc.), and/or can have a different tolerance (e.g. ±1%, ±3%, ±5%, etc.) than that of the supply voltage 804 (e.g. ±5%, ±10%, etc.). The PMIC 805 can further supply multiple different output voltages 808a and 808b to multiple output contacts on the edge connector 802, such as output contacts 809a and 809b, to enable the memory device 800 to provide the converted and/or regulated output voltages 808a and 808b to one or more devices external to the memory device 800 (e.g., another memory device without a PMIC, a processor, a chipset, another logic circuit, an expansion card, etc.).

Figure 9:
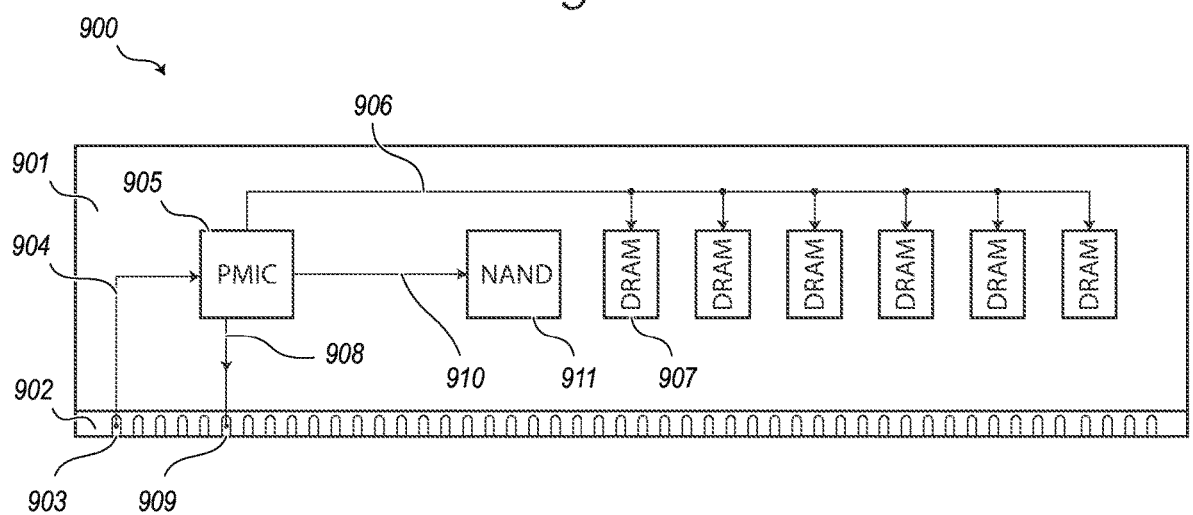

Although in the foregoing example embodiments, memory devices have been illustrated and described as providing multiple output voltages to multiple contacts of the edge connectors thereof, in other embodiments, a memory device can also provide multiple different output voltages to different devices internal thereto. FIG. 9 illustrates one such memory device 900 in accordance with an embodiment of the present technology. As can be seen with reference to FIG. 9, memory device 900 can be a memory module, such as a non-volatile DIMM (NVDIMM) or the like, having a substrate (e.g., a printed circuit board (PCB) or the like) 901 and an edge connector 902 on which a number of contacts are provided. While many of the contacts on edge connector 902 are configured to carry data, commands, addresses, enable signals or the like, others can be configured to supply a potential to the memory device 900, such as connector 903. As can be seen with reference to FIG. 9, connector 903 receives corresponding a supply voltage 904 from an external device (e.g., a host device to which the memory device 900 is connected by the edge connector 902) and provides the supply voltage to a voltage regulator such as PMIC 905. The PMIC 905 can convert the supply voltage 904 to one or more output voltages (e.g., VDD, VDDQ, VPP, VSS, VSSQ, etc.), such as first output voltage 906 for use by one or more connected memories, such as DRAM memories 907 (e.g., which can correspond to the memory device 100 illustrated in FIG. 1 and described in greater detail above). In this regard, the first output voltage 906 can have a different voltage level (e.g., 1.1V, 1.3V, 1.5V, etc.) than that of the supply voltage 904 (e.g., 12V, 5V, 3.3V, etc.), and/or can have a different tolerance (e.g. ±1%, ±3%, ±5%, etc.) than that of the supply voltage 904 (e.g. ±5%, ±10%, etc.). The PMIC 905 can further supply a second output voltage 910 to other internal devices, such as a non-volatile NAND memory 911. The second output voltage can have a different voltage level than that of the first output voltage 906, and/or can have a different tolerance than that of the second output voltage 906. The PMIC 905 can further supply the another a third output voltage 908 (e.g., which can be a different voltage level and/or tolerance than the first and second output voltages 906 and 910, or can correspond to one thereof) to an output contact on the edge connector 902, such as output contact 909, to enable the memory device 900 to provide the converted and/or regulated third output voltage 908 to one or more devices external to the memory device 900 (e.g., another memory device without a PMIC, a processor, a chipset, another logic circuit, an expansion card, etc.).

Although in the foregoing example embodiments, memory devices are illustrated and described as including a single voltage regulator/PMIC, one of skill in the art will readily appreciate that the function thereof can be provided by multiple voltage regulators and/or PMICs. For example, a memory device can (i) receive a single supply voltage that is provided to multiple PMICs to generate one or more output voltages, (ii) receive multiple supply voltages that are provided to corresponding PMICs to generate corresponding different output voltages, (iii) receive a single supply voltage that is provided to multiple PMICs to generate the same output voltage in multiple locations, (iv) some combination thereof, (v) or the like.

According to one aspect of the subject technology, a PMIC can include or be operably connected to a memory including one or more registers for storing information about the output voltage(s) of the PMIC. For example, the registers can include information corresponding to the voltage levels of the output voltages, tolerances of the output voltages, an order in which the output voltages are powered up and/or powered down, delays between powering up/down the output voltages, etc. In some embodiments, the PMIC can be configured to output the information or a portion thereof in response to a command (e.g., received by the memory device from a connected host device), to provide information on the operation of the PMIC. Moreover, in some embodiments, the PMIC can be configured to modify the information in the registers in response to a command (e.g., received by the memory device from a connected host device). For example, a host device can issue a command to the memory device to cause the PMIC to change information in the registers about a voltage level of an output voltage. In response, the PMIC can modify the voltage level in accordance with the modified information in the registers. In this manner, a PMIC can provide on-the-fly configurability in response to commands that can change the voltage levels of the output voltages, tolerances of the output voltages, an order in which the output voltages are powered up and/or powered down, delays between powering up/down the output voltages, etc.

Figure 10:
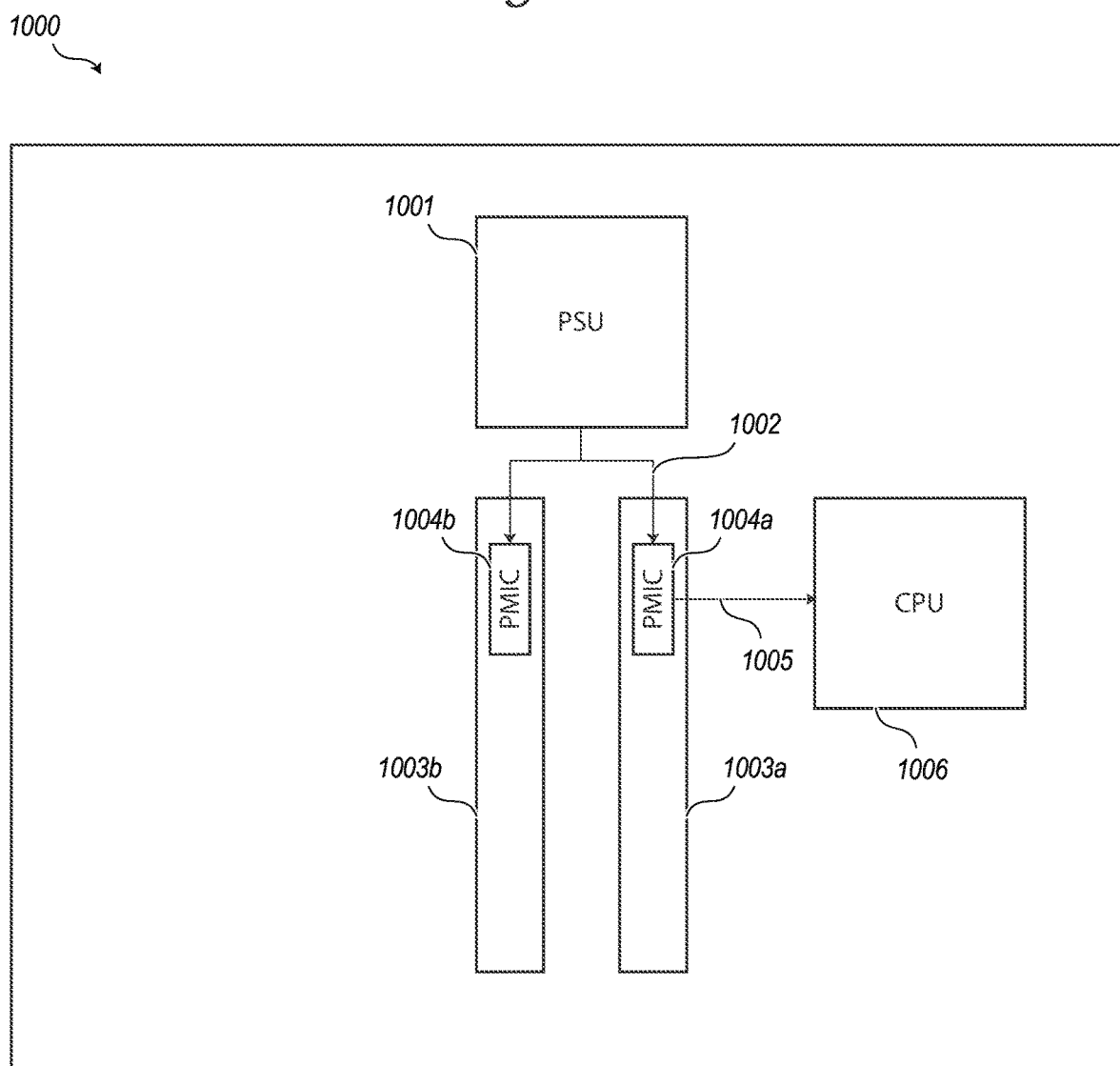
FIGS. 10-12 are simplified block diagrams schematically illustrating memory systems in accordance with various embodiments of the present technology.

FIG. 10 is a simplified block diagram schematically illustrating a memory system in accordance with an embodiment of the present technology. The memory system 1000 includes a power supply unit (PSU) 1001 configured to provide a supply voltage 1002 to one or more memory devices operably connected thereto, such as memory devices 1003a and 1003b. The memory devices 1003a and 1003b can each include a corresponding PMIC 1004a and 1004b configured to receive the supply voltage 1002 and to generate one or more output voltages (e.g., VDD, VDDQ, VPP, VSS, VSSQ, etc.) for use by one or more memories (e.g., such as memory device 100 illustrated in FIG. 1 and described in greater detail above) therein. One of the memory devices, such as memory device 1003a, can be configured to provide one or more output voltages generated by corresponding PMIC 1004a, such as output voltage 1005, to a device external to the memory device 1003a, such as processor (e.g. CPU) 1006.

While the memory devices 1003a and 1003b of the memory system 1000 are both illustrated as including a PMIC, in the embodiment illustrated in FIG. 10 only one of the memory devices is providing an output voltage to a device external thereto. In other embodiments, however, multiple memory devices in a memory system can provide output voltages to different external devices. One such system is illustrated schematically in FIG. 11, in accordance with embodiments of the present technology. As can be seen with reference to FIG. 11, memory system 1100 includes a PSU 1101 configured to provide a supply voltage 1102 to one or more memory devices operably connected thereto, such as memory devices 1103a and 1103b. The memory devices 1103a and 1103b can each include a corresponding PMIC 1104a and 1104b configured to receive the supply voltage 1102 and to generate one or more output voltages (e.g., VDD, VDDQ, VPP, VSS, VSSQ, etc.) for use by one or more memories (e.g., such as memory device 110 illustrated in FIG. 1 and described in greater detail above) therein. A first one of the memory devices, such as memory device 1103a, can be configured to provide one or more output voltages generated by corresponding PMIC 1104a, such as output voltage 1105, to a device external to the memory device 1103a, such as processor (e.g. CPU) 1106, and a second one of the memory devices, such as memory device 1103b, can be configured to provide one or more output voltages generated by corresponding PMIC 1104b, such as output voltage 1108, to a device external to the memory device 1103b, such as graphics processing unit (GPU) 1107.

Figure 11:
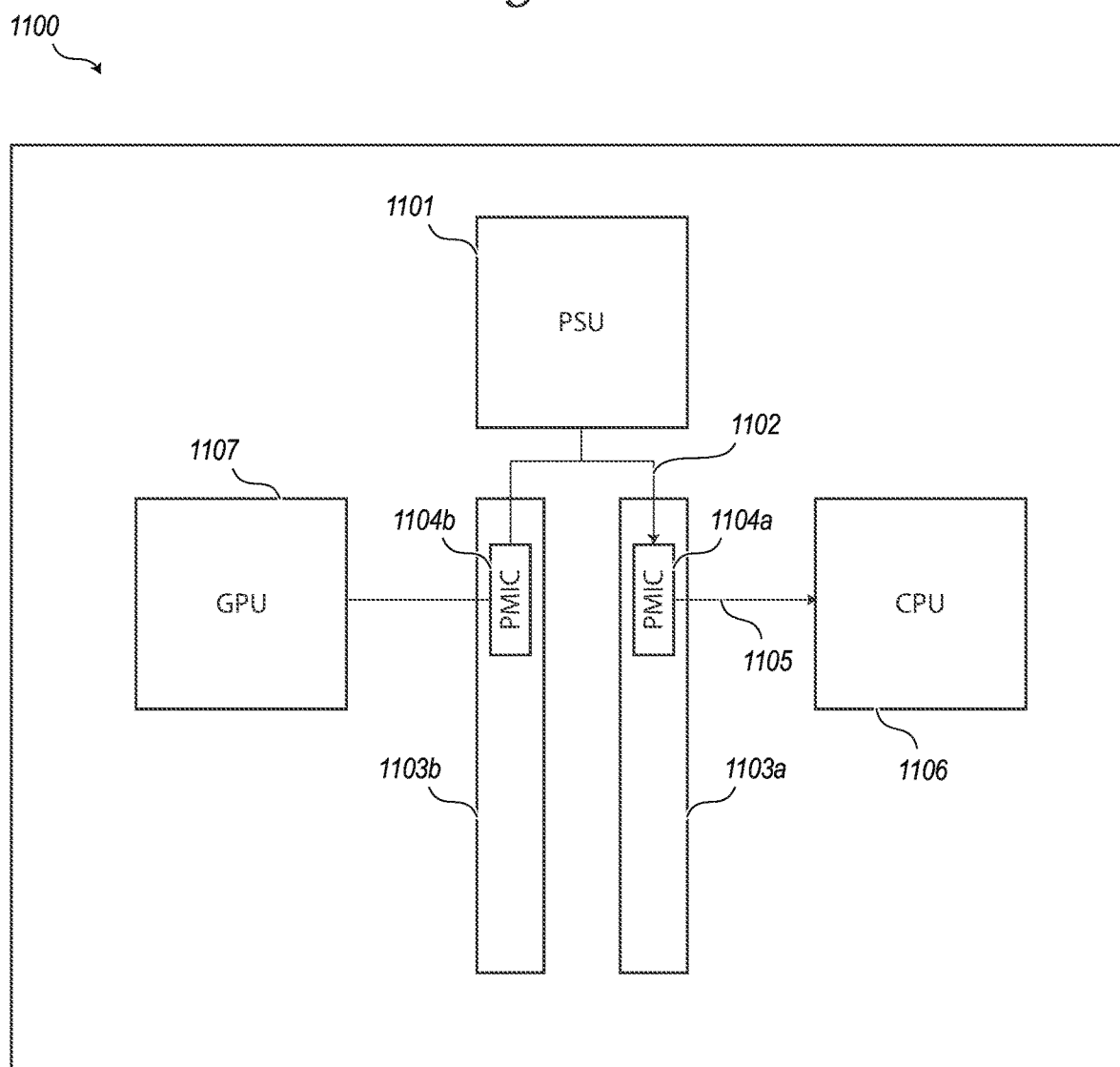
Figure 12:
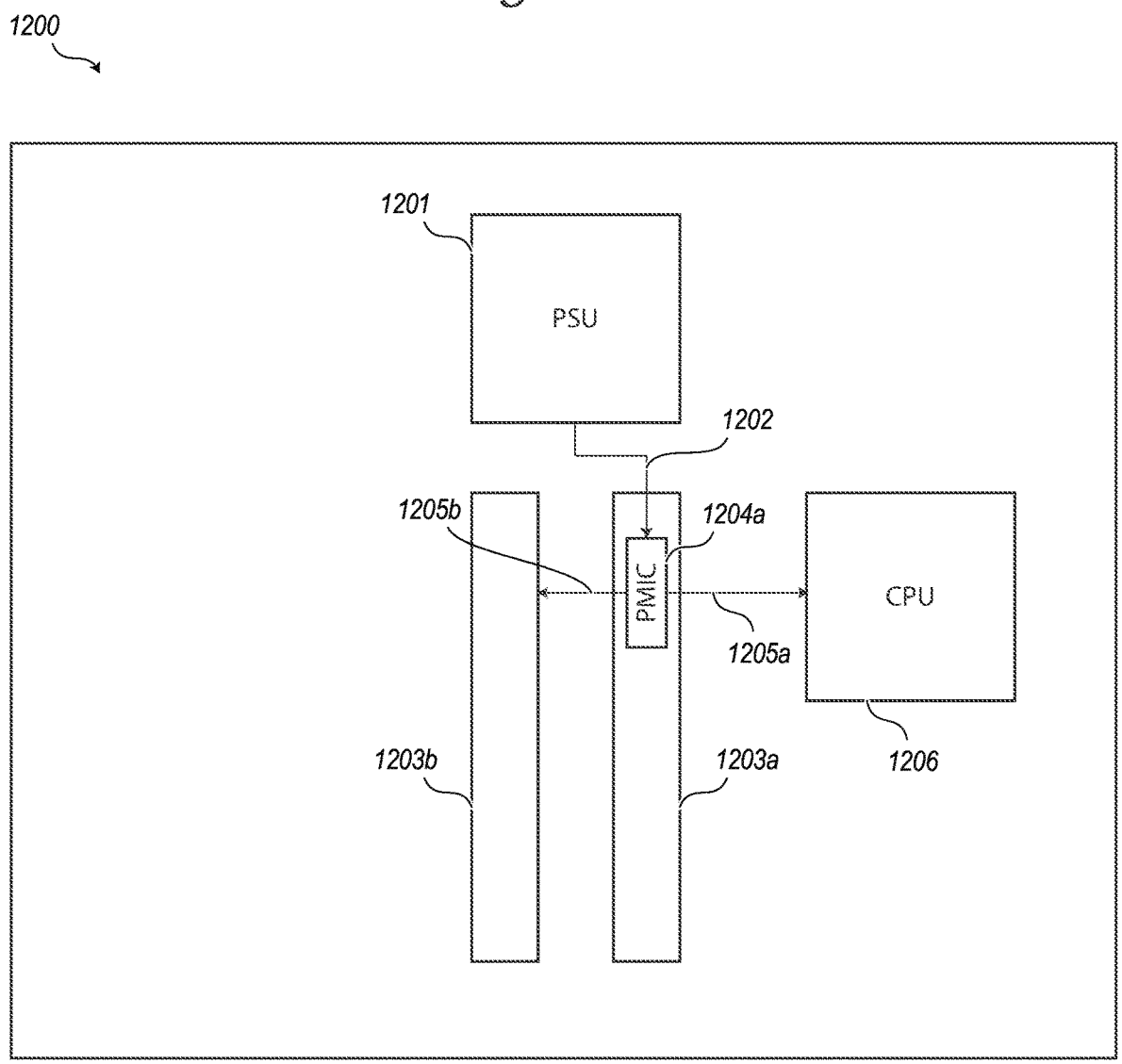

Although in the foregoing example embodiments of FIGS. 10 and 11, memory systems have been described and illustrated in which all of the memory devices connected thereto include PMICs, in other embodiments, a memory system may include a single memory device with a PMIC configured to provide an output voltage to other memory devices lacking a PMIC. One such system is illustrated schematically in FIG. 12, in accordance with embodiments of the present technology. As can be seen with reference to FIG. 12, memory system 1200 includes a PSU 1201 configured to provide a supply voltage 1202 to one or more memory devices operably connected thereto, such as memory devices 1203a and 1203b. A first one of the memory devices, such as memory device 1203a can include a corresponding PMIC 1204a configured to receive the supply voltage 1202 and to generate one or more output voltages (e.g., VDD, VDDQ, VPP, VSS, VSSQ, etc.) for use by one or more memories (e.g., such as memory device 120 illustrated in FIG. 1 and described in greater detail above) therein. The first memory device can be further configured to provide one or more output voltages generated by the corresponding PMIC 1204a, such as output voltages 1205a and 1205b, to devices external to the memory device 1203a. For example, the first output voltage 1205a can be provided to a processor (e.g. CPU) 1206, and a second output voltage 1205b can be provided to the second memory device 1203b, which lacks a corresponding PMIC. As can be seen with reference to FIG. 12, the second memory device 1203b is not directly coupled to the PSU 1201, but rather relies upon the PMIC 1204a of the first memory device 1203a for a regulated supply voltage.

Although in the foregoing example embodiments, memory devices have been illustrated and described with reference to DIMMs and NVDIMMs, one of skill in the art will readily appreciate that the present technology has application to memory devices of many different formats, whether in module form or otherwise. For example, memory devices are frequently provided in memory systems as surface-mounted chips, ball grid array (BGA) packages, removable devices (e.g., memory cards and/or sticks), and the like, all of which can benefit from the approaches to power management described above.

Figure 13:
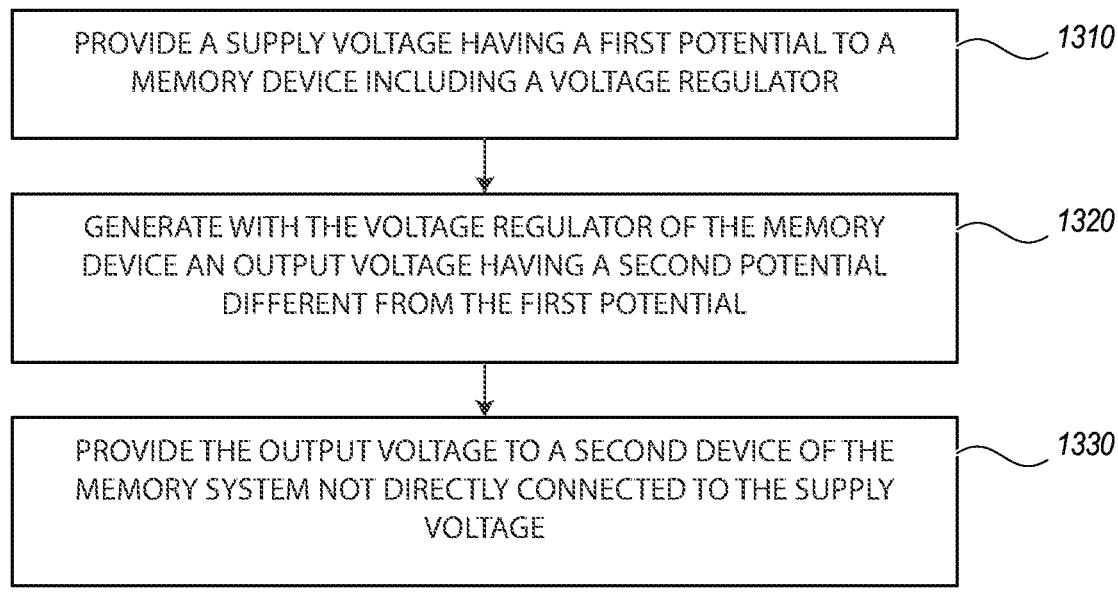
FIGS. 13 and 14 are flow charts illustrating methods for operating memory systems in accordance with various embodiments of the present technology.

FIG. 13 is a flow chart illustrating a method of operating a memory system in accordance with an embodiment of the present technology. The method includes providing a supply voltage having a first potential to a memory device (such as memory device 1103a illustrated in FIG. 11) including a voltage regulator (box 1310). The method further includes generating with the voltage regulator (such as PMIC 1104a illustrated in FIG. 11) of the memory device an output voltage having a second potential different from the first potential (box 1320). The method further includes providing the output voltage to a second device (such as PSU 1106) of the memory system not directly connected to the supply voltage (box 1330).

Figure 14:
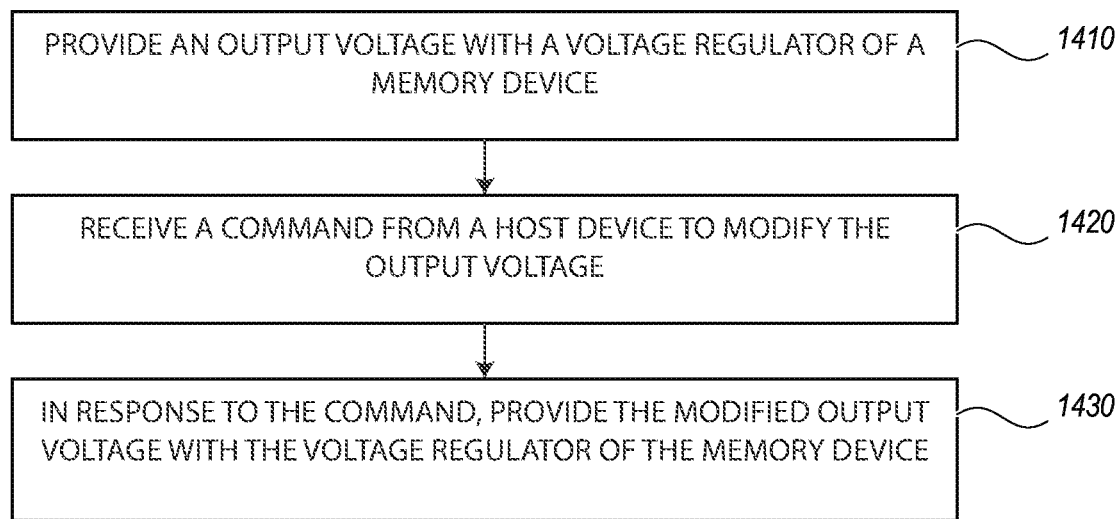

FIG. 14 is a flow chart illustrating a method of operating a memory system in accordance with an embodiment of the present technology. The method includes providing an output voltage with a voltage regulator (such as PMIC 1104a of FIG. 11) of a memory device (box 1410). The method further includes receiving a command from a host device (such as CPU 1106 of FIG. 11) to modify the output voltage (box 1420). The method further includes providing, in response to the command, the modified output voltage (such as output voltage 1105 of FIG. 11) with the voltage regulator of the memory device (box 1430).

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:
   one or more external inputs configured to receive a supply voltage having a first voltage level;
   a voltage regulator configured to receive the supply voltage from the one or more external inputs and to output an output voltage having a second voltage level different from the first voltage level;
   one or more memories configured to receive the output voltage from the voltage regulator; and
   one or more external outputs configured to receive the output voltage from the voltage regulator and to supply the output voltage to one or more connected devices, wherein the one or more connected devices are external to the memory device.

2. The memory device of claim 1,
   wherein the supply voltage is a first supply voltage,
   wherein the one or more external inputs are a first one or more external inputs,
   further comprising a second one or more external inputs configured to receive a second supply voltage having a third voltage level different from the first voltage level, and
   wherein the voltage regulator is further configured to receive the second supply voltage from the second one or more external inputs.

3. The memory device of claim 1,
   wherein the output voltage comprises a first output voltage and a second output voltage,
   wherein the one or more memories are configured to receive the second output voltage from the voltage regulator, and
   wherein the one or more external outputs are configured to receive the first output voltage from the voltage regulator and to supply the first output voltage to the one or more connected devices.

4. The memory device of claim 3,
   wherein the one or more external outputs are a first one or more external outputs,
   wherein the one or more connected devices comprise a first one or more connected devices,
   further comprising a second one or more external outputs, and
   wherein the second one or more external outputs are configured to receive the second output voltage from the voltage regulator and to supply the second output voltage to second one or more connected devices.

5. The memory device of claim 1,
   wherein the voltage regulator comprises a first voltage regulator and a second voltage regulator,
   wherein the output voltage comprises a first output voltage and a second output voltage,
   wherein the one or more memories are configured to receive the first output voltage from the voltage regulator, and
   wherein the one or more external outputs are configured to receive the second output voltage from the voltage regulator and to supply the second output voltage to the one or more connected devices.

6. The memory device of claim 1, wherein the voltage regulator comprises a power management integrated circuit (PMIC) that includes one or more registers configured to store information corresponding to the output voltage.

7. The memory device of claim 6, wherein the information comprises the second voltage level, a tolerance corresponding to the second voltage level, or a combination thereof.

8. The memory device of claim 6, wherein the PMIC is configured to output the information in response to receiving a command from a connected host device.

9. The memory device of claim 6, wherein the PMIC is configured to modify the information in response to receiving a command from a connected host device.

10. The memory device of claim 1, wherein the memory device is a memory module, and wherein the one or more external inputs and the one or more external outputs are comprised by an edge connector of the memory module.

11. The memory device of claim 10, wherein the memory module is a dual in-line memory module (DIMM).

12. The memory device of claim 1,
    wherein the output voltage comprises a first output voltage and a second output voltage,
    wherein the one or more memories comprise one or more volatile memories and one or more non-volatile memories,
    wherein the one or more volatile memories are configured to receive the first output voltage from the voltage regulator, and
    wherein the one or more non-volatile memories are configured to receive the second output voltage from the voltage regulator.

13. A method for operating a memory device, comprising:
    providing a supply voltage having a first voltage level to the memory device;
    generating from the supply voltage, with a voltage regulator of the memory device, an output voltage having a second voltage level different than the first voltage level; and
    providing the output voltage to a device external to the memory device.

14. The method of claim 13, wherein the device external to the memory device is a non-memory device.

15. The method of claim 13, wherein the device external to the memory device is a memory device not including a voltage regulator.

16. The method of claim 13, further comprising providing the output voltage to one or more memories of the memory device.

17. The method of claim 13,
wherein the output voltage comprises a first output voltage and a second output voltage,
wherein providing the output voltage to the device external to the memory device comprises providing the first output voltage to the device external to the memory device; and
further comprising providing the second output voltage to one or more memories of the memory device.

18. The method of claim 13,
wherein the supply voltage comprises a first supply voltage and a second output voltage,
wherein the output voltage comprises a first output voltage and a second output voltage,
wherein providing the output voltage to the device external to the memory device comprises providing the first output voltage to the device external to the memory device, and
further comprising providing the second output voltage to one or more memories of the memory device.

19. A method for operating a memory device, comprising:
receiving a supply voltage having a first voltage level at the memory device;
generating from the supply voltage, with a voltage regulator of the memory device, an output voltage having a second voltage level;
providing the output voltage from the memory device to a device external to the memory device;
receiving a command at the memory device to modify the output voltage;
in response to the command, modifying, with the voltage regulator, the output voltage to have a third voltage level; and
providing the modified output voltage from the memory device to the device external to the memory device,
wherein one or more of the second voltage level and the third voltage level are different than the first voltage level.

* * * * *